United States Patent [19]

Reimar et al.

[11] Patent Number: 4,793,067

[45] Date of Patent: Dec. 27, 1988

[54] POSITION MEASURING INSTRUMENT WITH PLURALITY OF REFERENCE

[75] Inventors: Wolfgang Reimar, Traunreut; Johann Oberhans, Post Emertsham, both of Fed. Rep. of Germany

[73] Assignee: Dr. Johannes Heidenhain GmbH, Traunreut, Fed. Rep. of Germany

[21] Appl. No.: 53,145

[22] Filed: May 21, 1987

[30] Foreign Application Priority Data

May 22, 1986 [DE] Fed. Rep. of Germany ....... 3617254

[51] Int. Cl.$^4$ .............................................. G01D 5/34
[52] U.S. Cl. .............................. 33/125 A; 250/237 G; 356/374
[58] Field of Search ............. 33/125 A, 125 C, 125 R; 356/374, 139, 142, 143, 148, 247, 248, 252, 373, 375, 383; 250/237 G

[56] References Cited

U.S. PATENT DOCUMENTS

| | | | |
|---|---|---|---|
| 4,519,140 | 5/1985 | Schmitt | 33/125 C |
| 4,529,964 | 7/1985 | Minomi et al. | 33/125 A X |
| 4,602,436 | 7/1986 | Ernst | 33/125 C |
| 4,606,642 | 8/1986 | Nelle | 33/125 C X |
| 4,654,527 | 3/1987 | Schmitt | 33/125 C X |
| 4,701,615 | 10/1987 | Schmitt | 33/125 C X |

Primary Examiner—William D. Martin, Jr.
Attorney, Agent, or Firm—Willian Brinks Olds Hofer Gilson & Lione Ltd.

[57] ABSTRACT

An instrument for measuring the relative position of two objects comprises a scale with an incremental graduation defining a measuring direction X. A plurality of identical reference marks are positioned along the graduation, each reference mark allocated absolutely to the graduation. To determine the absolute value of a reference mark, two successive spacings between the two reference marks preceding in the measuring direction X are determined. The two spacings are determined by scanning the incremental graduation.

10 Claims, 2 Drawing Sheets

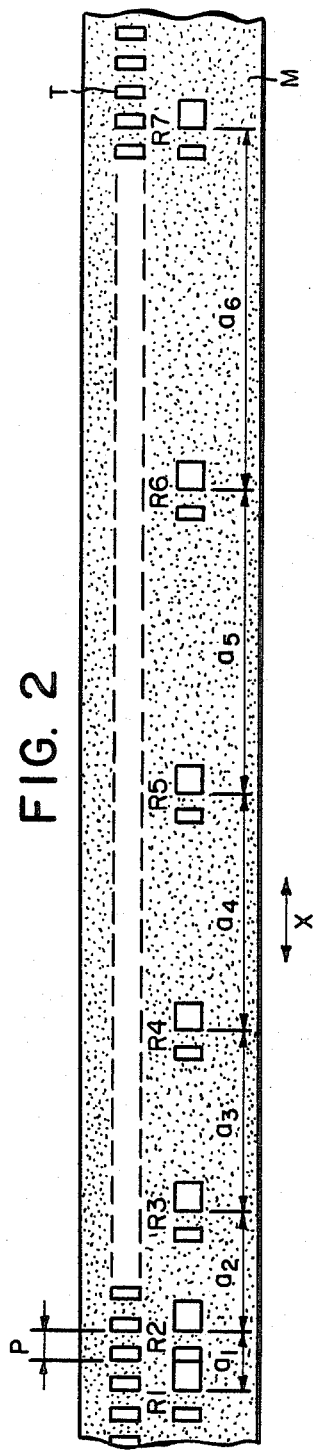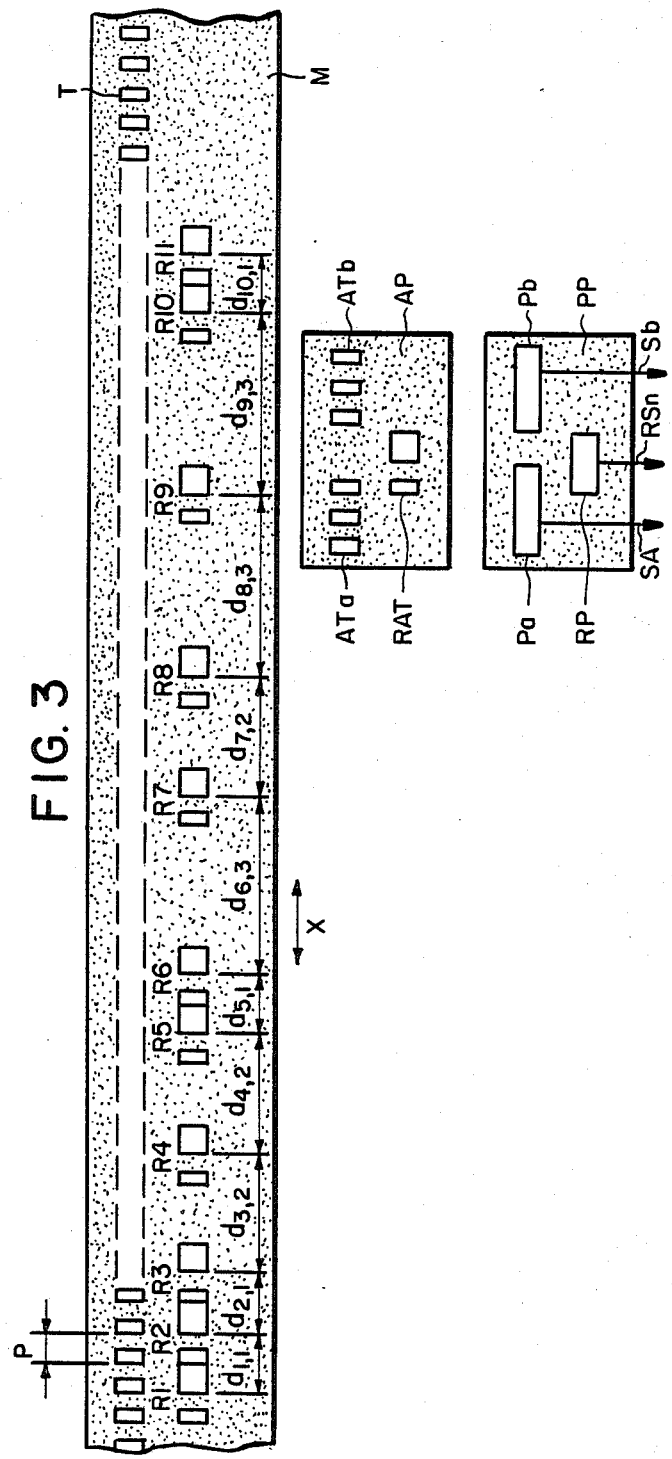

POSITION MEASURING INSTRUMENT WITH PLURALITY OF REFERENCE

BACKGROUND OF THE INVENTION

The present invention relates to a device for measuring the relative position of two objects comprising a graduation, a plurality of reference marks absolutely allocated to the graduation, and a scanning unit to scan the graduation and reference marks to generate at least one scanning signal and at least one reference signal, respectively.

Relative position measuring instruments are frequently used in processing machines to measure the relative position of a tool with respect to a workpiece. The instruments are also frequently used in coordinate measuring machines for the determination of the dimensions and the relative position of a test object.

In devices of this type, reference signals are generated during the scanning of the reference marks and are utilized in a variety of ways. For example, the reference signals may be used to reproduce the zero position in a counter, for beginning a measurement operation from a particular position, or for the recovery of a measurement position after an interruption in a measurement operation. The reference signals may also be used for communicating to an auxiliary control device connected to the measuring instrument.

German published application DE-AS No. 25 40 412 discloses a measuring instrument in which a measurement embodiment presents a graduation and identical reference marks. The reference marks are spaced with respect to one another and are absolutely allocated to the graduation. At least one selecting element in the form of a magnet slidable in a groove of the scale is provided for the selection of at least one reference mark. A scanning unit scans the graduation and the reference marks to generate at least one periodic scanning signal and at least one reference signal. A switching element contained in the scanning unit is activated when the selection element is scanned by the scanning unit. The switching element generates a selection signal. If the reference signal and the allocated selection signal occur simultaneously, a control signal is generated by a component connected to the outlet side of the measuring instrument.

One disadvantage of this measuring instrument is that, when the instrument is used, for example, on a processing machine, jarrings of the machine can displace the selection element from its desired position along the groove. If the selection element is displaced, the clear allocation of the selection element to the selected reference mark, as well as the activation of the selected reference mark, can no longer be assured. In the case of reference marks positioned closely adjacent one another, the displacements of the selection element can result in the selection of a false reference mark. Such an incorrect selection can result in the initiation of an incorrect control process, for example, the triggering of a zeroing process in a counter thereby resulting in a false measurement result. Additional means ar therefore needed to reproduceably fix each slidable selection element in the groove relative to the particular selected reference mark.

In German Patent DE-PS No. 32 45 914 there is described a measuring in which a measurement embodiment comprises a graduation and a plurality of identical reference marks. The reference marks are spaced with respect to one another and are absolutely allocated to the graduation. A track with at least one electrically applied selection datum is allocated to the reference marks for the selection of at least one reference mark required for the measurement. The selection information is scanned by an element of the scanning unit so that at least one reference mark can be selected and processed.

This type of measuring instrument assures an invariable, clear allocation of the selection information to the selected reference mark. However, the instrument is disadvantageous in that a separate track with the appertaining selection datum is needed for the selection of the reference marks. In addition, an additional element must be provided in the scanning unit for the scanning of the selection information.

In German Patent DE-PS No. 29 52 106 there is disclosed a measuring instrument in which a measurement embodiment comprises a graduation and a plurality of reference marks absolutely allocated to the graduation. Each reference mark presents a different line-group distribution. Within the scanning unit, a respective scanning field is allocated to each reference mark with an identical line-group distribution for the selection of the reference marks. One disadvantage of this arrangement is that it is relatively expensive since the line-group distributions of the individual reference marks and of the scanning fields must differ from one another as much as possible in order to make possible a clear identification of the individual reference marks. Also, the scanning arrangement must have an identical scanning field for each reference mark.

German unexamined patent specification DE-OS No. 30 39 483 discloses a measuring instrument in which a measurement embodiment comprises a graduation and a plurality of identical reference marks. The reference marks are located at equal intervals and are allocated absolutely to the graduation. A code mark is allocated to each reference mark for the identification of the individual identical reference marks. This arrangement has the disadvantage that separate scanning fields on the scanning plate of a scanning unit are required for the scanning of these marks.

German Patent DE-PS No. 24 16 212 discloses a measuring instrument in which a measurement embodiment comprises a graduation and identical reference marks absolutely allocated to the graduation. The absolute value of each reference mark is determined from its particular specific spacing to an adjacent reference mark. The differing spacings between adjacent reference marks are determined by scanning the incremental graduation. The reference mark and the appertaining adjacent reference mark must be scanned and their mutual specific spacing determined for the identification of each individual identical reference mark.

The disadvantage of this measuring instrument is that the greater the measurement length and therewith the number of identical reference marks, the greater the number of different spacings are required. The reference marks with the greatest allocated spacings are positioned so far apart that, for the identification and determination of the absolute values of the reference marks, large graduation distances must be scanned. Thus, the identification of these reference marks with a great number of allocated spacings is time consuming and therefore economically undesirable in a measuring instrument used in a processing machine. If in the processing machine a momentary position measuring value is lost, as for example by a power failure, then, once the disturbance is corrected, the absolute reference position of the measuring instrument must be recovered for further measuring processes. The redetermination of the absolute reference position is performed, for time reasons, by identifying the nearest situated reference mark. To identify the nearest reference mark and determine its absolute value, its apertaining adjacent mark must be scanned and their mutual specific spacing determined by scanning the incremental graduation. If the mutual specific spacing is very great, the identification of the reference mark is time consuming and contributes to the increase in down-time of the processing machine. In addition, the scanning of such great spacings may not be possible due to the particular geometry of the workpiece.

It is an object of the present invention to provide a measuring instrument of the type mentioned above which reduces the time expenditure for the identification and determination of the absolute values of the individual reference marks. It is a further object of the present invention to provide a measuring instrument wherein the number of reference marks per measuring length can be efficiently increased.

SUMMARY OF THE INVENTION

The present invention is directed to a measurement instrument for the measurement of the relative position of two objects, the instrument comprising a scale with an incremental graduation and a plurality of identical reference marks allocated absolutely to the graduation wherein the absolute value of each reference mark may be determined from two successive spacings between adjacent reference marks.

According to a preferred embodiment of the present invention, a scale M is provided with an incremental graduation and a plurality of identical reference marks. The positioning of the reference marks is such as to define, in the measurement direction, certain spacings. To determine the absolute value of a reference mark, the spacings between two adjacent reference marks are determined by scanning the scale with a scanning unit. The determined spacings are compared with spacings, and absolute values, previously stored to produce a corresponding absolute value. If desired, the spacings and absolute values previously stored and used in the comparison may be stored in dependence upon the direction in which the reference marks are scanned.

A particular advantage of this embodiment is that, through the proposed determination of at least two successive spacings, a higher density of reference marks may be placed on the measurement embodiment without additional expenditure and without additional elements. This would allow the state of a counter or other circuitry to be controlled or corrected at relatively frequent intervals. Preferably, two spacings may be combined for the identification of the reference marks. Since the spacings can occur multiply in the preferred embodiment, the total length of the two spacings is less than the single spacing of prior art embodiments because the single spacings generally must differ from one another. Accordingly, a considerable gain in space is yielded for providing additional reference marks on the measurement embodiment of the preferred embodiment. In the event of an interruption in the measurement operation, the determination of the next situated reference mark for the recovery of the reference position may be identified with reduced time expenditure.

The invention itself, together with further objects and attendant advantages, will best be understood by reference to the following detailed description, taken in conjunction with the accompanying drawings.

BRIEF DESCRIPTION OF THE DRAWINGS

FIG. 2 is a schematic plan view of a known measurement embodiment with a graduation and a plurality of reference marks.

FIG. 3 is a schematic plan view of a preferred embodiment of the present invention with a graduation, a plurality of reference marks, a scanning plate an a photoelement plate.

DETAILED DESCRIPTION OF THE PRESENTLY PREFERRED EMBODIMENT

Figure 1:
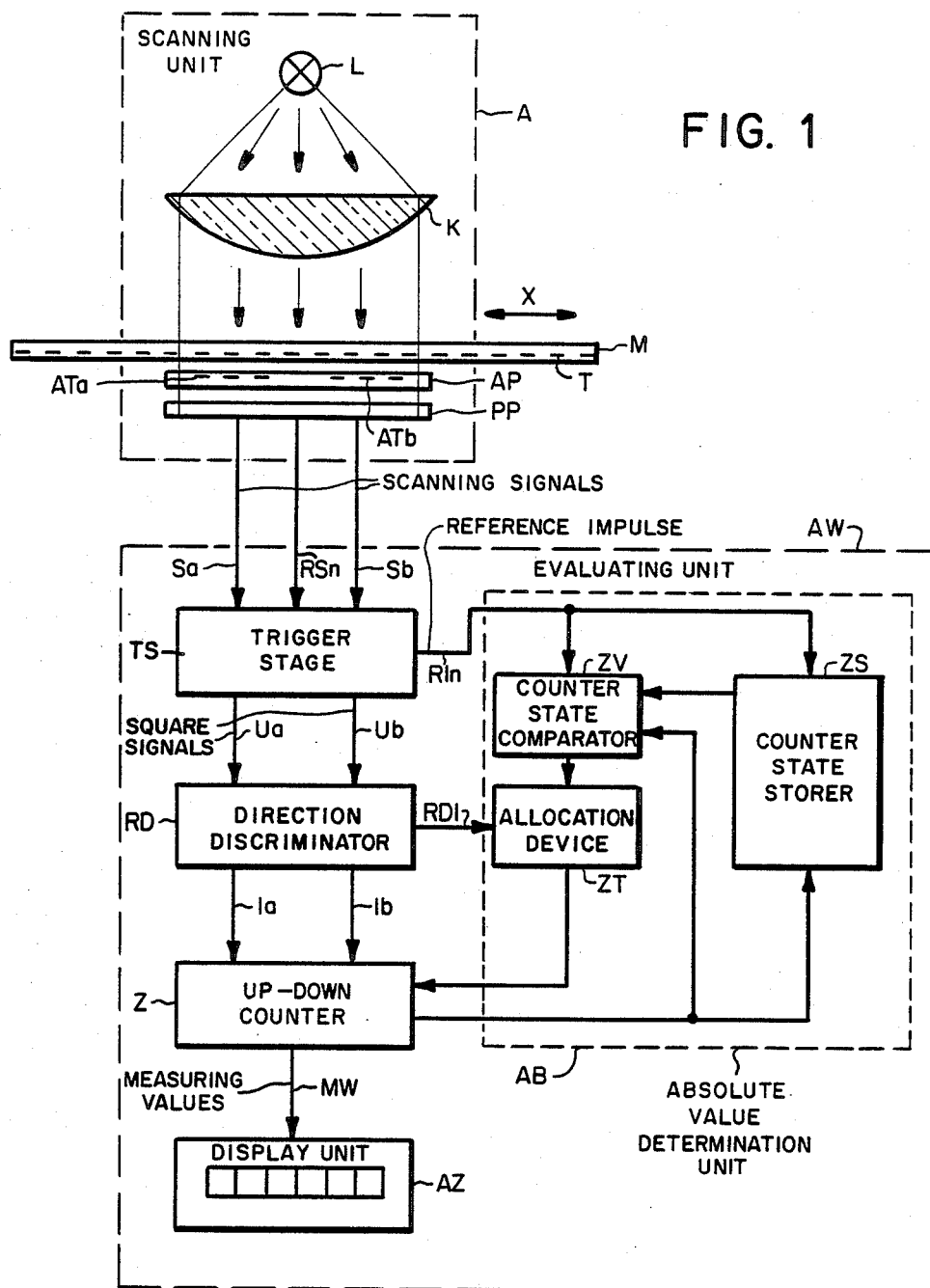
FIG. 1 shows a schematic side view of a photoelectric incremental length measuring instrument.

Turning now to the drawings, FIG. 1 represents, in a schematic side view, a photoelectric incremental length measuring instrument. The instrument comprises a measurement embodiment M in the form of a scale and a scanning unit A. The scale M and the scanning unit A are connected in a conventional manner (not shown) with two relatively movable objects whose relative position is to be measured. The two objects may be, for example, the bed and slide piece of a processing machine. An incremental graduation T is provided the scale M and photoelectrically scanned by the scanning unit A, without physical contact, using transmitted light. The scanning unit A comprises a light source L, a condenser K, a scanning plate AP, and a photoelement plate PP.

The scale M, the scanning plate AP and the photoelement plate PP are schematically represented in plan view in FIG. 3. The scale M comprises an incremental graduation T in the form of a periodic line grid defining a graduation period length P. The graduation T further defines a measuring direction X. Identical reference marks $R_n$ ($n=1, 2, 3, \ldots$) with a defined irregular line distribution are located along the graduation T in the measuring direction X and are absolutely allocated to the incremental graduation T. The reference marks $R_n$ define in the measurement direction X certain mutual spacings $d_{n,m}$ ($n,m=1, 2, 3, \ldots$) explained in greater detail below. The scanning plate AP comprises two scanning graduations ATa, ATb. Each scanning graduation ATa, ATb has the same period length P as the graduation T and is identically configured with the graduation T. The scanning graduations ATa, ATb are displaced in the measuring direction X with respect to one another by ¼ of the graduation period length P. Two photoelements Pa, Pb are allocated to the two scanning graduations ATa, ATb, respectively, for the scanning of the graduation T and are located on the photoelement plate PP.

During a measuring operation, the scanning unit A is moved relative to the scale M in the measuring direction X. Light beams emanating from the light source L are directed parallel by the condenser K and modulated by the graduation T and the two scanning graduations ATa, ATb. The modulated light falls on the two photoelements Pa, Pb which generate two periodic scanning signals Sa, Sb, respectively. The scanning signals Sa, Sb are conducted to a trigger stage TS located in an evaluating unit AW. (See FIG. 1) The trigger stage TS generates two square signals Ua, Ub from the two scanning signals Sa, Sb. The square signals Ua, Ub are applied to an up-down counter Z located in the evaluating unit AW by means of a direction discriminator RD. The up-down counter Z counts with the correct sign the impulses Ia, Ib generated by the direction discriminator RD. Measuring values MW are produced which represent the graduation units of the incremental graduation T counted with the correct sign by the up-down counter Z. The measuring values MW thus represent the relative position of the two objects and are digitally displayed in a display unit AZ. The determination of the measuring direction X in the direction discriminator RD occurs on the basis of the 90° phase displacement of the two square signals Ua, Ub. The 90° phase displacement arises from the relative displacement of the two scanning graduations ATa, ATb by $\frac{1}{4}$ of the graduation period length P.

The scanning plate AP comprise a reference scanning graduation RAT for the scanning of the individual identical reference marks Rn of the scale M. The reference scanning graduation RAT is identical in its line distribution with the line distribution of the reference marks Rn. A reference photoelement RP is allocated to the scanning graduation RAT and is located on the photoelement plate PP for the scanning of the individual identical marks Rn.

A known scale M with an incremental graduation T of graduation period length P is represented in FIG. 2. Structure similar in structure and function to that of the scale shown in FIG. 3 is designated by like reference numerals. Identical reference marks Rn are positioned along the graduation T in the measuring direction X. The reference marks Rn define a certain irregular line distribution and are allocated absolutely to the incremental graduation T. As the drawings indicate, the scale M represented in FIG. 2 is somewhat similar in structure to the scale M shown in FIG. 3.

In the known scale M shown in FIG. 2, there are defined, from left to right between the first reference mark R1 and a second reference mark R2, a first spacing $a_1$; between the second reference R2 and a third reference mark R3 a second spacing $a_2$; between the third reference mark R3 and a fourth reference mark R4 a third spacing $a_3$; and so on. The digit 1 of the spacing reference numeral $a_1$ designates a defined spacing unit. The digits 2, 3, . . . of the reference numerals $a_2$, $a_3$, . . . designate whole-number multiples of the defined spacing unit. In the example shown, the spacing corresponds to two graduation units of period length P of the incremental graduation T. The spacing $a_n$ (n=1, 2, 3 . . . ) between the reference marks Rn and the adjacent reference marks Rn+1 characterize the absolute values of the identical reference marks Rn, Rn+1 with respect to the incremental graduation T. The spacings $a_n$ are defined relative to the respective middles, reference centers, of the reference marks Rn, Rn+1.

During a measuring operation of the scale M of FIG. 2, the scanning unit A is moved with respect to the scale M along the measuring direction X, for example, from left to right. The movement of the scanning unit A results in the scanning of the reference marks R1, R2, R3, . . . by means of the reference scanning graduation RAT and the reference photoelement RP similar in structure and function to the elements shown in FIG. 3. The photoelement RP generates identical reference signals RSn corresponding to the identical reference marks Rn, which are indistinguishable. The reference signals RSn are fed to the trigger stage TS for the generation of reference impulses RIn. The reference impulses RIn are processed by an absolute value determination unit AB. The absolute value determination unit AB may be of the type described in German Patent DE-PS No. 24 16 212 which comprises a counter state storer, a counter state comparator, an allocation device and logical linkage elements.

By way of example, the absolute value of the reference marks may be determined as follows. When the scanning unit A is moved left to right in the positive measuring direction X, the first reference mark R1 and then the second reference mark R2 are scanned by the scanning unit A. The scanning of the first reference mark R1 produces a first reference impulse RI1. The first reference impulse RI1 causes the momentary counter state of the up-down counter Z to be stored in the counter state storer of the absolute value determination unit AB. A second reference impulse RI2 is generated in the scanning of the second reference mark R2. The second reference impulse RI2 causes the counter state comparator to determine the difference between the momentary counter state of the up-down counter Z and the counter state stored in the counter state storer. The difference between the two counter states represents the first spacing $a_1$ between the first reference mark R1 and the second reference mark R2. The first spacing $a_1$ contained in the counter state comparator is conducted to the allocation device. The allocation device outputs the apertaining absolute value of the second reference mark R2 to the up-down counter Z for the control of its counter state, and, in the event of an erroneous counter state, for the correction of the counter state.

When the scale M is scanned from right to left in the negative measuring direction X, the absolute value of the second reference mark R2 may be determined as follows. First the third reference mark R3 and then the second reference mark R2 are scanned. The second spacing $a_2$ of the counter state comparator is determined in a manner similar to the determination of the first spacing $a_1$ described above through the generation of a third reference impulse RI3 and a second reference impulse RI2. The second spacing $a_2$ is applied to the allocation device which outputs the apertaining absolute value of the second reference mark to the up-down counter Z for the control of the counter state and, if need be, for the correction of the counter state.

The absolute values allocated to the respective identical reference marks Rn are stored in tabular form in the allocation device in dependence upon the allocated specific spacing $a_{n-1}$, $a_n$ and in dependence upon the positive or negative measuring direction X. Thus, a separate table is provided for the spacings $a_{n-1}$ for the positive measuring direction and a separate table is provided for the spacing $a_n$ for the negative measuring direction X. The positive or negative measuring direction X in each case is conveyed to the absolute value determination unit AB by a direction impulse RDI generated by the direction discriminator RD. The determination of the absolute value of the reference mark Rn permits a reference position to be recovered which may have been lost during an interruption of the measurement operation. The reference position is recovered after obviation of the interruption by determining the absolute value of the next situated reference mark Rn.

With this embodiment, the greater the measuring length of the scale M and number of identical reference marks Rn, the greater the number of different spacings $a_n$ required. The reference marks Rn with the greatest allocated spacings a lie far apart. Thus, for the identification and determination of the absolute values of these reference marks Rn, corresponding lengths of the incremental graduation T must be scanned.

To reduce the amount of time expended in the identification and determination of the absolute values of the reference marks Rn and for the increase in the number of reference marks Rn per measuring length, it is proposed that the absolute value of each reference mark Rn be determined by at least two successive spacings $d_{n-2,m}$, $d_{n-1,m}$; $d_{n-1,m}$, $d_{n,m}$; $d_{n,m}$, $d_{n+1,m}$ between a reference mark Rn and at least two adjacent reference marks Rn−2, Rn−1; Rn−1, Rn+1; Rn+1, Rn+2, as shown in the embodiment of FIG. 3.

To determine the absolute value of the third reference mark R3 of the scale M shown in FIG. 3, the following is given as an example. The scale M is scanned, for example, from left to right in the positive measuring direction X. The first reference mark R1 is scanned by the scanning unit A and then the second reference mark R2 is scanned by the scanning unit A. A first reference impulse RI1 is generated in response to the scanning of the first reference mark R1 and causes the momentary counter state of the up-down counter Z to be stored in the counter state storer of the absolute value determination unit AB. A second reference impulse RI2 is generated in the scanning of the second reference mark R2 and causes the counter state comparator to determine the difference between the momentary counter state of the up-down counter Z and the counter state contained in the counter state storer. The difference between the two counter states represents the first spacing $d_{1,1}$ between the first reference R1 and a second reference mark R2. The first spacing $d_{1,1}$ of the counter state comparator is conducted to the allocation device and the momentary counter state of the up-down counter Z is stored in the counter state storer.

Next, the third reference mark R3 is scanned to generate a third reference impulse RI3. The third reference impulse RI3 causes the counter state comparator to determine the difference between the momentary counter state of the up-down counter Z and the counter state of the counter state storer. The difference between the two counter states represents the second spacing $d_{2,1}$ between the second reference mark R2 and the third reference mark R3. The second spacing $d_{2,1}$ of the counter state comparator is likewise conducted to the allocation device. On the presence of the first spacing $d_{1,1}$ and the second spacing $d_{2,1}$ the allocation device generates the apertaining absolute value of the third reference mark R3 to the up-down counter Z for the control of the counter state or, if need be, for the correction of the counter state.

As a further illustration, to determine the absolute value of the third reference mark R3 from right to left in the negative measuring direction X, the fifth reference mark R5 and then the fourth reference mark R4 are scanned. A fifth reference impulse RI5 is generated in the scanning of the fifth reference mark R5. The fifth reference impulse RI5 causes the momentary counter state of the up-down counter Z to be stored in the counter state storer of the absolute value determination unit AB. A fourth reference impulse RI4 is generated in the scanning of the fourth reference mark R4 and causes the counter state comparator to determine the difference between the momentary counter state of the up-down counter Z and the counter state contained in the counter state storer. The difference between the counter states represents the first spacing $d_{4,2}$ between the fifth reference mark R5 and the fourth reference mark R4. The first spacing $d_{4,2}$ of the counter state comparator is conducted to the allocation device. The momentary counter state of the up-down counter Z is stored in the counter state storer. A third reference impulse RI3 is generated during the subsequent scanning of the third reference mark R3. The third reference impulse RI3 causes the counter state comparator to determine the difference between the momentary counter state of the up-down counter Z and the counter state contained in the counter state storer. The difference between the two counter states represents the second spacing $d_{3,2}$ between the fourth reference mark R4 and the third reference mark R3. The second spacing $d_{3,2}$ of the counter state comparator is similarly conducted to the allocation device. On presentation of the first spacing $d_{4,2}$ and the second spacing $d_{3,2}$, the allocation device delivers the apertaining absolute value of the third reference mark R3 to the up-down counter Z for control of the counter state or, if need be, for correction of the counter state.

In FIGS. 2 and 3, the spacings $a_n$ and $d_{n,m}$ are defined to extend between the respective middles, reference centers, of the reference marks Rn, Rn+1. The reference centers mark the absolute position of the reference marks Rn to the incremental graduation T. The spacings $d_{n,m}$ correspond to m spacing units and each spacing unit corresponds to two graduation units of graduation period length P.

The known scale ,, shown in FIG. 2, has seven reference marks R1–R7 and six mutually specific spacings $a_1$–$a_6$ which must differ one from the other. The scale M of the preferred embodiment, shown in FIG. 3, has 11 reference marks R1–R11 and 10 mutual spacings $d_{1,1}$, $d_{2,1}$, $d_{3,2}$, $d_{4,2}$, $d_{5,1}$, $d_{6,3}$, $d_{7,2}$, $d_{8,3}$, $d_{9,3}$, $d_{10,1}$. Since for the 11 reference marks R1–R11 only three different spacings $d_{1,1} = d_{2,1} = d_{5,1} = d_{10,1}$ (m=1 spacing unit); $d_{3,2} = d_{4,2} = d_{7,2}$ (m=2 spacing units); $d_{6,3} = d_{8,3} = d_{9,3}$ (m=3 spacing units) are required, the 11 reference marks R1–R11, shown in FIG. 3, have a smaller space requirement than the 7 reference marks R1–R7 shown in FIG. 2.

As described above, for the identification and determination of the absolute position of a reference mark Rn, preferably two successive spacings $d_{n-2,m}$, $d_{n-1,m}$; $d_{n-1,m}$, $d_{n,m}$; $d_{n,m}$, $d_{n+1,m}$ are used. It should be understood, however, that more than two spacings can be used. Also, shown in FIG. 3, the different combinations of two spacings may have either equal spacings or unequal spacings. In any positive measuring direction X and any negative measuring direction X there can occur identical combinations of two spacings. However, these identical combinations are distinguishable with the aid of the particular measuring direction X.

Different combinations of the least number of spacings $d_{n,m}$ are represented from left to right in FIG. 3. The different combinations of the least number of spacings $d_{n,m}$ make it possible to provide as many reference marks Rn per measuring length unit as possible. The following table lists in the first line the numerical value of the index n of the spacings $a_n$, according to the embodiment shown in FIG. 2. The second line presents the numerical value of the index m of the spacings $d_{n,m}$, according to the embodiment shown in FIG. 3. The indices n and m signify n and m spacing units, wherein each spacing unit corresponds to two graduation units of graduation period length P.

TABLE

| n | 1 | 2 | 3 | 4 | 5 | 6 | 7 | 8 | 9 | 10 | 11 | 12 | 13 | 14 | 15 | 16 | 17 | S = 153 |
|---|---|---|---|---|---|---|---|---|---|----|----|----|----|----|----|----|----|---------|
| m | 1 | 1 | 2 | 2 | 1 | 3 | 2 | 3 | 3 | 1  | 4  | 2  | 4  | 3  | 4  | 4  | 1  | S = 41  |

As evident from the table, the scale M shown in FIG. 2 requires an interval S of 153 spacing units for the accommodation of 18 reference marks. In contrast, the scale M shown in FIG. 3 requires only an interval S of 41 spacing units to accommodate 18 similar reference marks.

With the aid of the determined absolute value of the reference mark, it is possible by means of the two spacings to determine the absolute values of the reference marks preceding in the measuring direction.

In the above example, the preferred manner is to provide identical reference marks. However, the invention is successfully usable in measuring instruments that have non-identical reference marks.

The reference marks Rn can also be provided on at least two parallel arranged reference mark tracks, not shown. This arrangement would allow the reference marks Rn to follow very closely upon one another. The reference marks Rn of each track may then be scanned by an allocated reference scanning element and the reference signals produced therefrom evaluated in a suitable manner in the evaluating unit AW.

Of course, it should be understood that a wide range of changes and modifications can be made to the preferred embodiments described above. It should also be understood that, although the described embodiment determined the absolute value of a reference mark by determining the spacings preceding the reference marks, it is within the scope of the present invention to obtain the absolute value by determining the spacings succeeding or surrounding the reference marks. Such a determination could be performed indirectly through the use of the neighboring reference marks or by appropriately storing in the allocation device the absolute values in dependence upon the desired spacings.

It is therefore intended that the foregoing detailed description be regarded as illustrative rather than limiting, and that it be understood that it is the following claims, including all equivalents, which are intended to define the scope of this invention.

We claim:

1. In a measuring instrument for measuring the relative position of two relatively movable objects, the instrument comprising a measuring scale and a scanning unit, the measuring scale defining a graduation and a plurality of reference marks absolutely allocated to the graduation, the graduation defining a measuring direction, the scanning unit operative to scan the graduation and the reference marks to produce at least one scanning signal and at least one reference signal, respectively, the improvement comprising:

means for defining each reference mark along the graduation wherein each two adjacent reference marks defines a respective spacing such that a unique absolute value for each reference mark is determinable from at least two of the spacings.

2. The invention of claim 1 wherein the invention further comprises an absolute value determination unit; and wherein the at least two spacings are communicatable to the absolute value determination unit to determine the absolute value of each reference mark.

3. The invention of claim 2 wherein the improvement further comprises means for counting the scanning signals to produce a counter state; wherein the absolute value determination unit comprises:
   a counter state storer for storing the state of the means for counting;
   a counter state comparator operative to compare at least two states produced by the means for counting; and
   an allocation unit comprising previously defined spacings.

4. The invention of claim 3 wherein the allocation device comprises information representative of the respective at least two spacings which determine the absolute value of each reference mark.

5. The invention of claim 1 wherein the improvement further comprises:
   means for determining the direction of scanning; and
   means for distinguishing between at least a first at least two spacings obtained from scanning the graduation and reference marks in a first direction and a second at least two spacings, identical to the first two spacings, obtained from scanning the graduation and reference marks in a second direction, based upon the direction of scanning.

6. The invention of claim 1 wherein the at least two spacings are distinguishable when the reference marks are scanned in a selected measuring direction.

7. The invention of claim 1 wherein the graduation defines a graduation period; and wherein the spacings are formed of whole-number multiples of the graduation period.

8. The invention of claim 1 wherein the reference marks are positioned to define a plurality of substantially parallel configurations.

9. In a measuring instrument for measuring the relative position of two relatively movable objects, the instrument comprising a measuring scale and a scanning unit, the measuring scale defining a graduation, the graduation defining a graduation period and a measuring direction, the scanning unit operative to scan the graduation and the reference marks, the improvement comprising:

means for defining a plurality of reference marks on the measuring scale, the reference marks spaced relatively to one another to define spacings between each adjacent reference mark, the spacings such that the value of each reference mark is absolutely and uniquely determined by at least two spacings located along the measuring direction, each spacing being a whole-number multiple of the graduation period;

means for determining a value for each reference mark by scanning the reference marks and graduation to produce a count of the graduations located between a selected reference mark and a preselected reference position;

means for storing the count produced by the means for determining a value;

means for comparing the stored count and the count produced by the means for determining a value to determine the spacing between any two reference marks; and storage means containing information indicative of the unique absolute value of each reference mark as a function of at least two spacings.

10. The invention of claim 9 wherein the at least two spacings are positioned adjacent to one another and precede the respective reference mark in the direction of scanning the reference mark.

* * * * *

UNITED STATES PATENT AND TRADEMARK OFFICE
CERTIFICATE OF CORRECTION

PATENT NO. : 4,793,067
DATED : December 27, 1988
INVENTOR(S) : Wolfgang Reimar et al.

It is certified that error appears in the above-identified patent and that said Letters Patent is hereby corrected as shown below:

IN THE BACKGROUND OF THE INVENTION

In column 1, line 61, please delete "ar" and substitute therefor --are--.

IN THE SUMMARY OF THE INVENTION

In column 4, line 16, please delete "an" and substitute therefor --and--.

IN THE DETAILED DESCRIPTION OF
THE PRESENTLY PREFERRED EMBODIMENT

In column 4, line 30, after "provided" please insert --on--.

In column 7, line 3, please delete "a" and substitute therefor --$a_n$--.

UNITED STATES PATENT AND TRADEMARK OFFICE
CERTIFICATE OF CORRECTION

PATENT NO. : 4,793,067

DATED : December 27, 1988

INVENTOR(S) : Wolfgang Reimar et al.

It is certified that error appears in the above-identified patent and that said Letters Patent is hereby corrected as shown below:

In column 8, line 33, please delete ",," and substitute therefor --M--.

Signed and Sealed this

Seventeenth Day of September, 1991

*Attest:*

HARRY F. MANBECK, JR.

*Attesting Officer*  *Commissioner of Patents and Trademarks*